(12) United States Patent
Hasegawa

(10) Patent No.: US 8,625,194 B2
(45) Date of Patent: Jan. 7, 2014

(54) SEMICONDUCTOR OPTICAL AMPLIFIER

(75) Inventor: Hideaki Hasegawa, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 56 days.

(21) Appl. No.: 13/472,029

(22) Filed: May 15, 2012

(65) Prior Publication Data

US 2012/0243074 A1  Sep. 27, 2012

Related U.S. Application Data

(63) Continuation of application No. PCT/JP2010/070468, filed on Nov. 17, 2010.

(30) Foreign Application Priority Data

Nov. 17, 2009  (JP) ................ 2009-262304

(51) Int. Cl.
*H01S 5/10* (2006.01)
*H01S 5/50* (2006.01)
*H01S 5/323* (2006.01)
*H01S 5/343* (2006.01)

(52) U.S. Cl.
CPC ............. *H01S 5/1014* (2013.01); *H01S 5/5027* (2013.01); *H01S 5/32391* (2013.01); *H01S 5/34306* (2013.01); *Y10S 977/815* (2013.01); *Y10S 977/95* (2013.01)
USPC ........ 359/344; 977/815; 977/950; 372/50.22; 372/66

(58) Field of Classification Search
CPC .... H01S 5/1014; H01S 5/1003; H01S 5/5027
USPC .......................................... 359/344
See application file for complete search history.

(56) References Cited

U.S. PATENT DOCUMENTS 5,003,550 A * 3/1991 Welch et al. ............... 372/50.22
5,175,643 A   12/1992 Andrews
(Continued)

FOREIGN PATENT DOCUMENTS

JP   3-228380   10/1991
JP   5-218594    8/1993
(Continued)

OTHER PUBLICATIONS

Visser, T.D.; Blok, H.; Demeulenaere, B.; Lenstra, D., "Confinement factors and gain in optical amplifiers," Quantum Electronics, IEEE Journal of, vol. 33, No. 10, pp. 1763,1766, Oct. 1997 doi: 10.1109/3.631280. URL: http://ieeexplore.ieee.org/stamp/stamp.jsp?tp=&arnumber=631280&isnumber=13706.*

(Continued)

*Primary Examiner* — Mark Hellner
*Assistant Examiner* — Ari M Diacou
(74) *Attorney, Agent, or Firm* — Oblon, Spivak, McClelland, Maier & Neustadt, L.L.P.

(57) ABSTRACT

A semiconductor optical amplifier includes an input-side optical amplifier waveguide section that has a first active core layer. An output-side optical amplifier waveguide section connects to the input-side optical amplifier waveguide section and has a second active core layer that is wider than the first active core layer. The width of the first active core layer and relative refractive index difference between the first active core layer and adjacent clad section in the width direction of the first active core layer, and the width of the second active core layer and relative refractive index difference between the second active core layer and adjacent clad section in the width direction of the second active core layer are set such that the carrier density and optical confinement factor in the first active core layer are higher than the carrier density and optical confinement factor in the second active core layer.

4 Claims, 11 Drawing Sheets

(56) References Cited

U.S. PATENT DOCUMENTS

| | | | |
|---|---|---|---|
| 5,228,049 A * | 7/1993 | Paoli | 372/50.22 |
| 5,392,308 A * | 2/1995 | Welch et al. | 372/92 |
| 5,499,261 A * | 3/1996 | Welch et al. | 372/50.11 |
| 5,537,432 A * | 7/1996 | Mehuys et al. | 372/50.11 |
| 5,592,503 A * | 1/1997 | Welch et al. | 372/50.11 |
| 5,602,864 A * | 2/1997 | Welch et al. | 372/50.11 |
| 5,696,779 A * | 12/1997 | Welch et al. | 372/18 |
| 5,703,897 A * | 12/1997 | Welch et al. | 372/50.1 |
| 5,737,352 A | 4/1998 | Tiemeijer et al. | |
| 5,799,024 A * | 8/1998 | Bowers et al. | 372/11 |
| 5,802,084 A * | 9/1998 | Bowers et al. | 372/18 |
| 5,864,574 A * | 1/1999 | Welch et al. | 372/50.22 |
| 5,889,898 A * | 3/1999 | Koren et al. | 385/9 |
| 5,894,492 A * | 4/1999 | Welch et al. | 372/50.1 |
| 5,909,614 A * | 6/1999 | Krivoshlykov | 438/29 |
| 5,914,978 A * | 6/1999 | Welch et al. | 372/50.22 |
| RE37,051 E * | 2/2001 | Welch et al. | 372/50.22 |
| RE37,354 E * | 9/2001 | Welch et al. | 372/50.1 |
| 6,545,801 B2 * | 4/2003 | Morito | 359/344 |
| 2004/0131102 A1 * | 7/2004 | Jette et al. | 372/97 |
| 2006/0222024 A1 * | 10/2006 | Gray et al. | 372/18 |
| 2009/0122393 A1 * | 5/2009 | Morito et al. | 359/344 |

FOREIGN PATENT DOCUMENTS

| | | |
|---|---|---|
| JP | 8-340147 | 12/1996 |
| JP | 10-341061 | 12/1998 |
| JP | 10-512720 | 12/1998 |
| JP | 2002-232083 | 8/2002 |
| JP | 2003-69162 | 3/2003 |
| JP | 2005-276904 | 10/2005 |
| JP | 2009-21454 | 1/2009 |

OTHER PUBLICATIONS

International Search Report mailed Dec. 21, 2010 in PCT/JP2010/070468 filed Nov. 17, 2010 (in English).

Ken Morito et al., "A Broad-Band MQW Semiconductor Optical Amplifier With High Saturation Output Power and Low Noise Figure", IEEE Photonics Technology Letters, vol. 17, No. 5, May 2005, pp. 974-976.

* cited by examiner

SEMICONDUCTOR OPTICAL AMPLIFIER

TECHNICAL FIELD

The present invention relates to a semiconductor optical amplifier.

BACKGROUND ART

In optical communication, in order to compensate for transmission loss of optical fibers, or insertion loss of optical components such as AWG (Arrayed Waveguide Grating), optical amplifiers having low noise and high gain are very essential. Current excitation type semiconductor optical amplifiers (SOAs) differ from Er-Doped Fiber Amplifiers (EDFA) in that there is no need for a pumping laser, so the optical amplifier is compact and inexpensive. Particularly, in recent years, semiconductor optical amplifiers have received a lot of attention because they are compact and can be integrated into small optical circuits such as AWG. In the initial stages of development of semiconductor optical amplifiers, the semiconductor optical amplifiers had lower saturation output power and inferior noise figure (NF) characteristics when compared with EDFA, however, as development has progressed in recent years, semiconductor optical amplifiers have been reported that are comparable to EDFA from the aspect of saturation output and noise figure (for example, refer to Patent document 1, and Non Patent document 1).

First, the saturation power, gain factor and net gain, which are parameters that determine the light output of a semiconductor optical amplifier will be explained. The light output of a semiconductor optical amplifier depends on the saturation power parameter. A semiconductor optical amplifier having a large saturation power is capable of achieving large light output because it is difficult for gain saturation to occur even when the input power is amplified and the output power becomes large. Taking the saturation power to be Isat, Isat can be expressed by Equation (1) below.

$$Isat = h\nu/(\Gamma Ag\tau) \times W \times d \quad (1)$$

In equation (1), h is Planck's constant, $\Gamma$ is the optical confinement factor in waveguide structure that performs optical amplification, Ag is the differential gain factor, $\tau$ is spontaneous carrier lifetime of light, W is the width of the active core layer, and d is the thickness of the active core layer.

By taking the gain factor of the active core to be g(n) (n is the carrier density), g(n) can be expressed by Equation (2) below.

$$g(n) = Ag \times (n - n0) \quad (2)$$

Wherein, In Equation (2), n0 is the transparent carrier density.

The net gain G, which is the gain per unit length that includes the waveguide dependency or optical loss of the semiconductor optical amplifier can be expressed by Equation 3 below.

$$G = \Gamma \times g(n) - \alpha = \Gamma \times Ag \times (n - n0) - \alpha \quad (3)$$

Wherein, in Equation (3), $\alpha$ is the loss coefficient of light.

Next, the design of a semiconductor optical amplifier for obtaining high efficiency and high output power characteristics will be explained. FIG. 12 is a diagram illustrating the profile in the lengthwise direction of a semiconductor optical amplifier having a preferred net gain $G=\Gamma \times g(n) - \alpha$ in order to obtain high efficiency and high output power characteristics. Note, on the horizontal axis, "Input" is the side where the signal light having small strength is input, and "Output" is the side where the signal light that has been amplified and whose strength has become large output. As illustrated in FIG. 12, in a preferred profile, on the input side where the strength of the signal light is low, the width of the active core layer is narrow, the carrier density is high, the optical confinement factor is high and the net gain is high. On the other hand, on the output side where the strength of the signal light is large, by making the width of the active core layer large, the optical confinement factor low and the saturation output Isat large in order for the light output not to saturate, the net gain becomes low.

Conventionally, in order to achieve the net gain profile as illustrated in FIG. 12, a semiconductor optical amplifier having a tapered waveguide structure has been widely used. FIG. 13 is a diagram that illustrates the waveguide structure in the width direction of a conventional semiconductor optical amplifier. As illustrated in FIG. 13, this semiconductor optical amplifier 200 outputs input signal light IL, which was input from an input section 200a, from an output section 200b as an output signal light OL. This semiconductor optical amplifier 200 is such that both sides in the width direction of a mesa shaped active core layer 30 have an embedded mesa waveguide structure that is embedded by a current blocking semiconductor layer 31 that functions as a clad section. Furthermore, the active core layer 30 comprises a narrow width section 30a on the side of the input section 200a having a relatively narrow width, and a wide width section 30b comprising a tapered section 30ba having a tapered shape such that it increases in width going toward the output section 200b side, and a wide section 30bb having a wide width. In FIG. 13, reference number D2 indicates the optical electric field strength distribution of the input signal light IL in the width direction in the narrow width section 30a. With the construction described above, this semiconductor optical amplifier 200 is such that on the input section 200a side the carrier density, optical confinement factor and net gain are high, and on the output section 200b side, the wide width section 30b increases the saturation output Isat and lowers the net gain.

PATENT DOCUMENT

Patent document 1: Japanese Patent Application Laid-open (JP-A) No. 2009-21454,

NON PATENT DOCUMENT

Non Patent document 1: K. Morito et al., "A Broad-Band MQW Semiconductor Optical Amplifier With High Saturation Output Power and Lower Noise Figure", IEEE Photonics Technol. Lett., Vol. 17, No. 5, pp. 974-976, May 2005

DISCLOSURE OF INVENTION

Problems to be Solved by the Invention

However, in conventional embedded mesa waveguide structure, when the width (mesa width) of the narrow width section 30a on the input side is too narrow, the optical confinement in the width direction becomes weak, and the optical confinement factor will end up decreasing. As a result, even though the carrier density becomes high, an increase in net gain is hindered, and there is a problem in that it is not possible to obtain the desired high efficiency and high output power characteristics.

FIG. 14 is a diagram illustrating the calculation results from calculating the relationship between the width of the narrow width section 30a (active core layer width) and the confinement factor. Further, the relative refractive index difference (Δ3) between the narrow width section 30a and the current blocking semiconductor layer 31 is taken to be about 0.16%. As illustrated by the curve C2 in FIG. 14, as the active core layer width narrows from 4 μm to 1 μm, the confinement factor decreases 32% from 1.13% to 0.76%. Therefore, from FIG. 14 it can be seen that narrowing of the width of the narrow width section 30a hinders an increase in net gain. Taking into consideration the problems described above, the object of the present invention is to provide a semiconductor optical amplifier that is capable of obtaining high efficiency and high output power characteristics.

Means for Solving the Problems

In order to solve the problems described above and achieve the object, the semiconductor optical amplifier regarding the present invention comprises: an input-side optical amplifier waveguide section that has a first active core layer; and an output-side optical amplifier waveguide section that connects to the input-side optical amplifier waveguide section and that has a second active core layer that is wider than the first active core layer; wherein the width of the first active core layer and relative refractive index difference between the first active core layer and adjacent clad section in the width direction of the first active core layer, and the width of the second active core layer and the relative refractive index difference between the second active core layer and adjacent clad section in the width direction of the second active core layer are set such that the carrier density and optical confinement factor in the first active core layer are higher than the carrier density and optical confinement factor in the second active core layer.

Further, in the semiconductor optical amplifier regarding the present invention the clad section adjacent in the width direction of the first active core layer is a polyimide, and the clad section adjacent in the width direction of the second active core layer is a semiconductor.

Moreover, in the semiconductor optical amplifier regarding the present invention, the input-side optical amplifier waveguide section further comprises a semiconductor protective layer that is formed on at least the side surfaces of the first active core layer.

Furthermore, the semiconductor optical amplifier regarding the present invention comprises: an input-side electrode that supplies power to the input-side optical amplifier waveguide section; and an output-side electrode that is electrically isolated from the input-side and that supplies power to the output-side optical amplifier waveguide section.

Effects of the Invention

According to the present invention, because an effective increase in net gain that conforms narrowed active core layer on the input side can be realized, the effect of obtaining the high efficiency and high output power characteristics is achieved.

BEST MODE(S) FOR CARRYING OUT THE INVENTION

Figure 1:
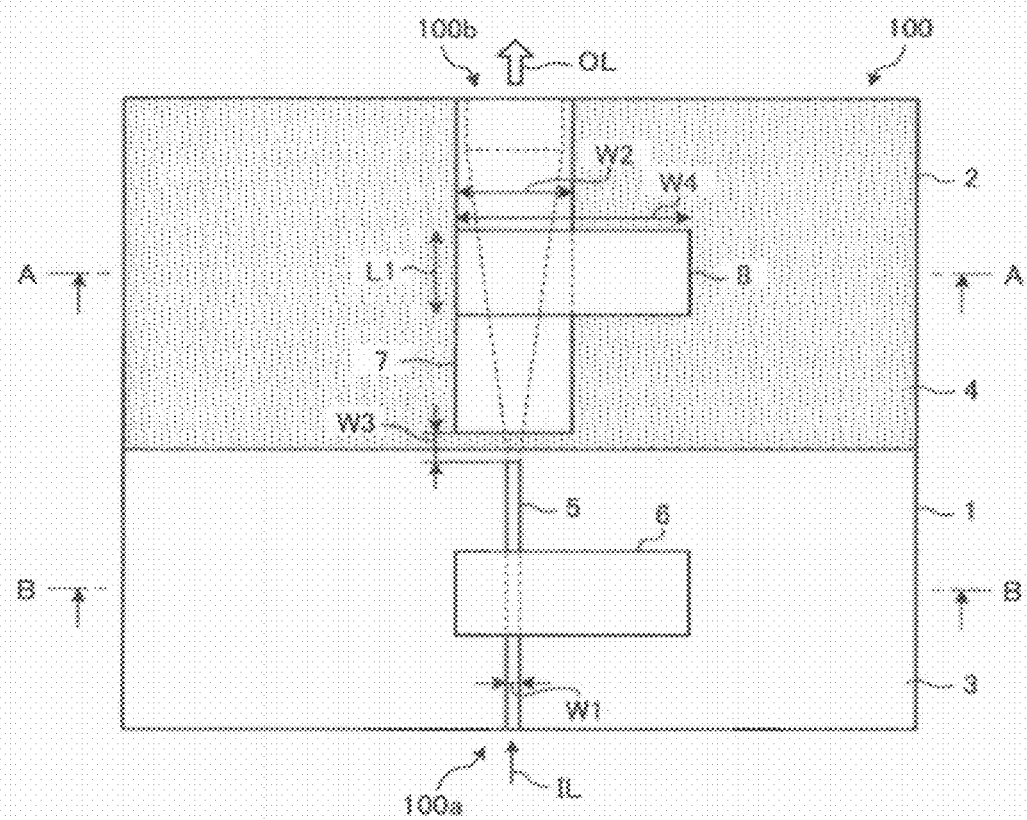
FIG. 1 is a top view that schematically illustrates a semiconductor optical amplifier of a first embodiment of the invention.

In the following, embodiments of a semiconductor optical amplifier regarding the present invention will be explained in detail with reference to the accompanying drawings. The present invention is not limited to these embodiments. In the drawings, the same reference numbers are given to identical or corresponding elements.

Embodiment 1

A semiconductor optical amplifier for amplifying light in the wavelength 1.55 μm band is explained as a first embodiment of the present invention. FIG. 1 is a top view that schematically illustrates the semiconductor optical amplifier of this first embodiment of the invention. As illustrated in FIG. 1, this semiconductor optical amplifier 100 comprises an input-side optical amplifier waveguide section 1, and an output-side optical amplifier waveguide section 2 that is connected to the input-side optical amplifier waveguide section 1, and amplifies input signal light IL that is input from an input section 100a, and outputs the result as output signal light OL from an output section 100b. Moreover, reference number 3 is a polyimide electrode pad support member, reference number 4 is a dielectric protective film, reference number 5 is an input-side p-side electrode, reference number 7 is an output-side p-side electrode, and reference numbers 6 and 8 are electrode pads. As an example of the width W1 of the input-side p-side electrode 5 and the width W2 of the output-side p-side electrode 7, the width W1 is 1.5 μm and width W2 is 20 μm. A width W3 that is 10 μm, for example, is formed between the input-side p-side electrode 5 and output-side p-side electrode 7 such that the electrodes are electrically isolated. Moreover, as an example of the length L1 and width W4 of the electrode pad 8, the length L1 is 200 μm and the width W4 is 600 μm. The size of the electrode pad 6 is the same as that of the electrode pad 8.

Figure 2:
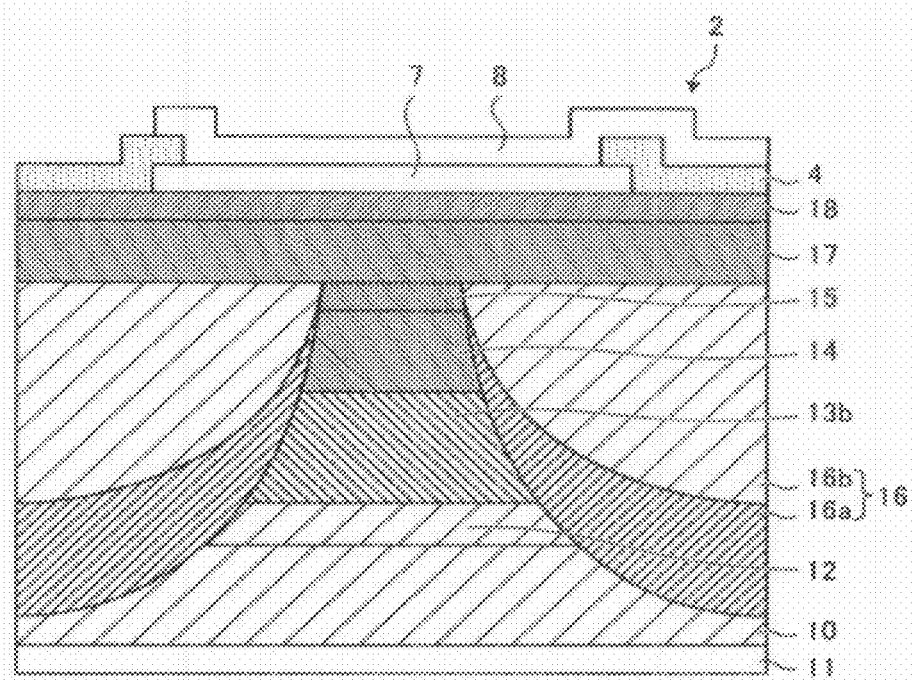
FIG. 2 is a cross-sectional diagram of the section A-A of the semiconductor optical amplifier illustrated in FIG. 1.

FIG. 2 is a cross-sectional diagram of section A-A of the semiconductor optical amplifier illustrated in FIG. 1. As illustrated in FIG. 2, the output-side optical amplifier waveguide 2 has layered structure in which an n-type InP lower clad layer 12 that performs the role of a buffer layer, a second active core layer 13b, and p-type InP upper clad layers 14 and 15 are layered on an n-type InP substrate 10 having an n-side electrode 11 formed on the rear side thereof. From part of the substrate 10 to the upper clad layer 15 is a mesa structure, with both sides being embedded by a p-type InP lower current blocking semiconductor layer 16a and an n-type InP upper current blocking semiconductor layer 16b to become an embedded mesa structure. Moreover, a p-type InP upper clad layer 17 and p-type InGaAsP contact layer 18 are layered on the upper clad layer 15 and current blocking semiconductor layer 16. Moreover, the output-side p-side electrode 7 is formed on the contact layer 18 so that it covers the entire second active core layer 13b, and is protected by a SiN dielectric protective film 4. Furthermore, an electrode pad 8 is formed such that it comes in contact with the output-side p-side electrode 7 at the opening sections that are formed in the dielectric protective film 4.

The second active core layer 13b is composed of InGaAsP, and comprises an MQW-SCH active layer that is formed with 3-stage Separate Confinement Heterostructure (SCH: Separate Confinement Heterostructure) above and below Multi Quantum Well (MQW) structure. Note, the MQW, for example, has layered structure comprising 3 pairs of a 4 nm well layer and 10 nm barrier layer.

Figure 3:
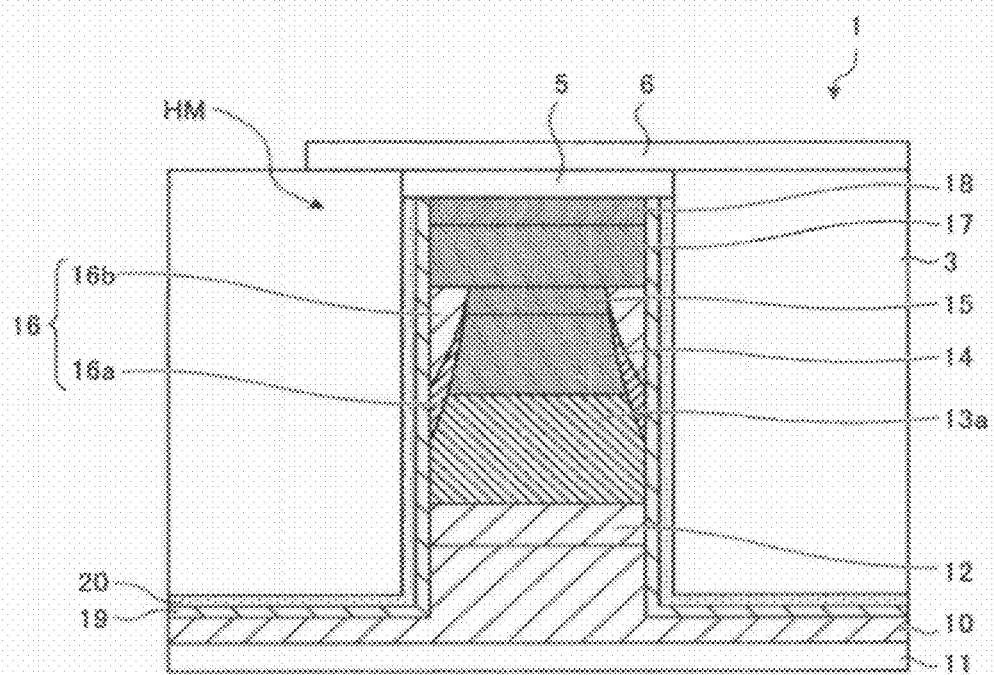
FIG. 3 is a cross-sectional diagram of the section B-B of the semiconductor optical amplifier illustrated in FIG. 1.

Next, FIG. 3 is a cross-sectional view of section B-B of the semiconductor optical amplifier illustrated in FIG. 1. As illustrated in FIG. 3, the input-side optical amplifier waveguide section 1 is similar to the output-side optical amplifier waveguide section 2, and has a layered structure in which a lower clad layer 12, a first active core layer 13a, upper clad layers 14, 15 and 17 and a contact layer 18 are layered on a substrate 10 that has an n-side electrode 11 formed on the rear side thereof. In addition, this input-side optical amplifier waveguide section 1 has high-mesa HM structure where the surface on both sides of the first active core layer 13a are cut from the contact layer 18 to a depth that reaches part of the substrate 10. A current blocking semiconductor layer 16 that comprises a lower current blocking semiconductor layer 16a and an upper current blocking semiconductor layer 16b exists a little on the surfaces of both sides of the first active core layer 13a, however, the current blocking semiconductor layer 16 is not necessary. Moreover, the side surfaces of this high-mesa structure HM and the top surface of the substrate 10 are sequentially covered by an InP semiconductor protective layer 19 and SiN dielectric protective film 20. The semiconductor protective layer 19 covers the side surfaces of the first active core layer 13a and has the function of reducing the surface recombination of the carriers. In addition, an input-side p-side electrode 5 is formed on the contact layer 18. Furthermore, a polyimide electrode pad support member 3 is formed on both sides of the high-mesa structure HM, and an electrode pad 6 is formed so that it covers from the input-side p-side electrode 5 over the electrode pad support member 3.

Moreover, the first active core layer 13a comprises an MQW-SCH active layer similar to that of the second active core layer 13b.

Figure 4:
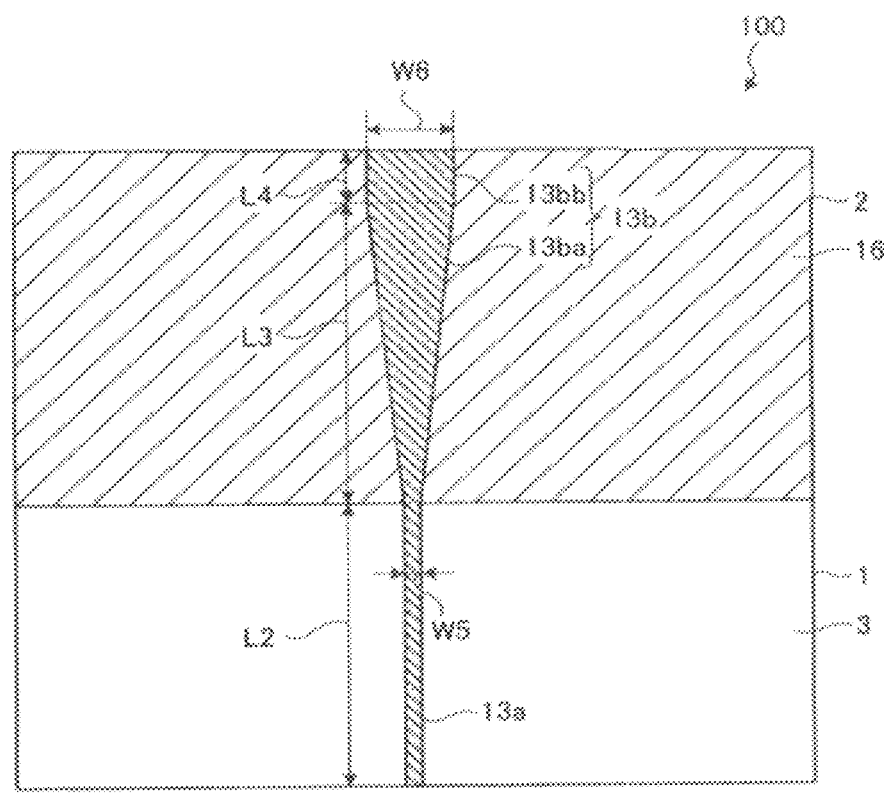
FIG. 4 is a diagram that schematically illustrates waveguide structure in the width direction of the semiconductor optical amplifier illustrated in FIG. 1.

Next, FIG. 4 is a diagram that schematically illustrates the waveguide structure in the width direction of the semiconductor optical amplifier 100 illustrated in FIG. 1. As illustrated in FIG. 4, the output-side optical amplifier waveguide section 2 of the semiconductor optical amplifier 100 is similar to the waveguide structure illustrated in FIG. 13, where both sides in the width direction of the second active core layer 13b have embedded mesa waveguide structure that is embedded by a current blocking semiconductor layer 16 that functions as a clad section. Furthermore, the second active core layer 13b comprises a tapered section 13ba that has a tapered shape that widens going toward the side of the output section 100b, and a wide equal width section 13bb.

On the other hand, in the input-side optical amplifier waveguide section 1, the first active core layer 13a has high-mesa waveguide structure. Here, as illustrated in FIG. 3, the thickness of the semiconductor protective layer 19 and dielectric protective film 20 is thin, and even when there is a current blocking semiconductor layer 16, that layer exists at just a small degree, so in this waveguide structure, the polyimide electrode pad support member 3 that is formed on both sides in the width direction of the first active core layer 13a essentially functions as a clad section.

Here, the width W5 of the first active core layer 13a is the same as the width W1 of the input-side p-side electrode 5, for example is 1.5 μm. Also, for the second active core layer 13b, the width of the tapered section 13ba changes in a tapered shape from width W1 to the width W6 of the equal width section 13bb. The width W6 for example is 4 μm. In addition, the length L2 of the first active core layer 13a is 1 mm for example, the length L3 of the tapered section 13ba of the second active core layer 13b is 0.8 mm for example, and the length L4, which is equal to the width of section 13bb, is 0.2 mm for example.

On one hand, the first active core layer is composed of GaAsP, so the effective index of refraction at a wavelength of 1.55 μm is about 3.175, and the index of refraction at a wavelength of 1.55 μm of the electrode pad support member 3, which is essentially a clad section in the width direction of the first active core layer 13a, is about 1.5, so the relative refractive index difference (Δ1) between the first active core layer 13a and the electrode pad support member 3 is about 45%, which is extremely large. On the other hand, the index of refraction of the second active core layer 13b is also about 3.175 at a wavelength of 1.55 μm, and the index of refraction of the InP current blocking semiconductor layer 16, which is a clad section in the width direction of the second active core layer 13b, is 3.17 at a wavelength of 1.55 μm, so the relative refractive index difference (Δ2) between the second active core layer 13b and the current blocking semiconductor layer 16 is 0.16%, which is much smaller than the relative refractive index difference Δ1 between the first active core layer 13a and the electrode pad support member 3.

As described above, this semiconductor optical amplifier 100 is constructed such that the width of the second active core layer 13b is larger than the width of the first active core layer 13a, and the relative refractive index difference Δ1 between the first active core layer 13a and the electrode pad support member 3 is larger than the relative refractive index difference Δ2 between the second active core layer 13b and the current blocking semiconductor layer 16. Therefore, in the first active core layer 13a, the carrier density can be made higher than that of the second active core layer 13b by narrowing the width. Together with this, in the first active core layer 13a, optical confinement in the width direction becomes high due to the high relative refractive index difference Δ1, so a suitable effect of increasing the carrier density is obtained without a decrease in the optical confinement factor even though the width becomes narrow. As a result, in this semiconductor optical amplifier 100, the net gain of the input-side optical amplifier waveguide section 1 becomes high.

Figure 5:
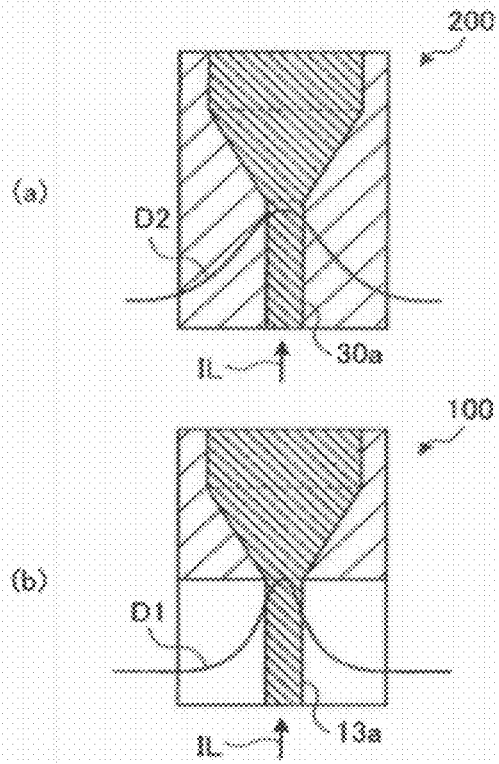
FIG. 5 are diagrams that compare the waveguide structure of a conventional semiconductor optical amplifier illustrated in FIG. 13 and the waveguide structure of a first embodiment illustrated in FIG. 4.
Figure 13:
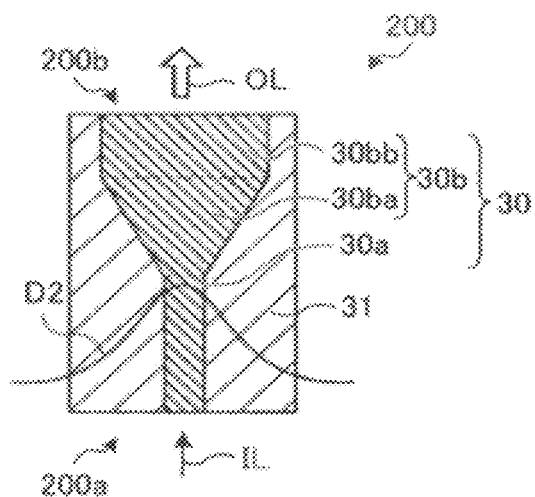
FIG. 13 is a diagram that schematically illustrates wave guide structure in the width direction of a conventional semiconductor optical amplifier.

FIG. 5 are diagrams comparing the waveguide structure of the conventional semiconductor optical amplifier 200 illustrated in FIG. 13 with the waveguide structure of the semiconductor optical amplifier 100 regarding this embodiment illustrated in FIG. 4. The waveguide structure of the conventional semiconductor optical amplifier 200 illustrated in FIG. 5(a) has embedded mesa structure in which the entire amplifier is embedded under a semiconductor layer, so the relative refractive index difference Δ3 between the active core layer and the current blocking semiconductor layer is relatively small. As a result, as the width of the narrow width section 30a where the input signal light IL is input becomes narrow in order to increase the carrier density, the optical confinement becomes weak, and the electric field intensity distribution D2 of the light spreads, resulting in a decrease in the optical confinement factor.

On the other hand, in the waveguide structure regarding the semiconductor optical amplifier 100 of the first embodiment of the invention illustrated in FIG. 5(b), the first active core layer 13a on the input side has high-mesa structure, so the relative refractive index difference Δ1 is extremely high. As a result, even though the width is made narrow in order to increase the carrier density in the first active core layer 13a where the input signal light IL is input, the electric field intensity distribution D1 of the light does not spread, so there is no decrease in the optical confinement factor.

Figure 12:
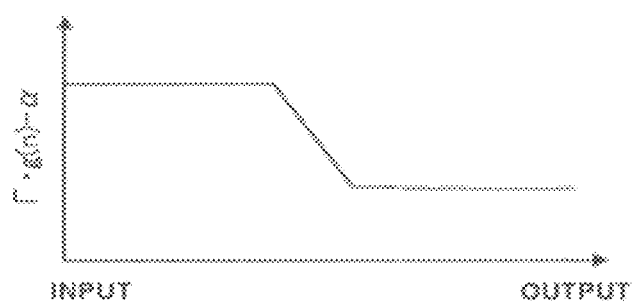
FIG. 12 is a diagram that illustrates the preferred net gain profile in the lengthwise direction of a semiconductor optical amplifier in order to obtain high efficiency and high output power characteristics.

In the semiconductor optical amplifier 100 of this first embodiment, the second active core layer 13b of the optical amplifier waveguide section 2 on the output side has embedded mesa structure, and in order that the optical confinement factor does not become high as in high-mesa structure, Isat in Equation (1) is made high. By doing so, the semiconductor optical amplifier 100 of this first embodiment achieves the preferred net gain profile as illustrated in FIG. 12, and is capable of obtaining the desired high efficiency and high output power characteristics.

Figure 6:
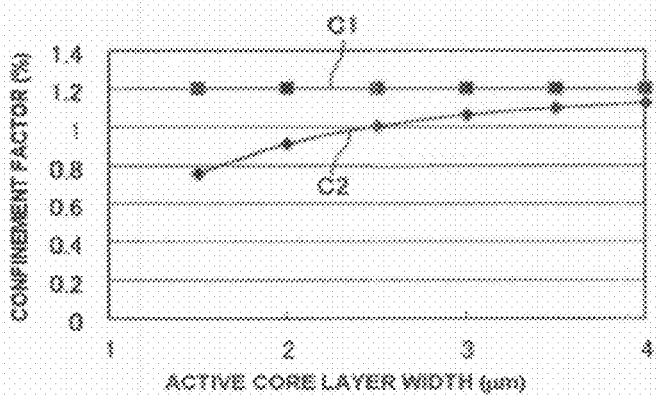
FIG. 6 is a diagram that illustrates the calculation results of the relationship between the width of the narrow section or first active core layer 13a and the confinement factor in the waveguide structure of a conventional semiconductor optical amplifier illustrated in FIG. 13 and the waveguide structure of a semiconductor optical amplifier of a first embodiment illustrated in FIG. 4.
Figure 7:
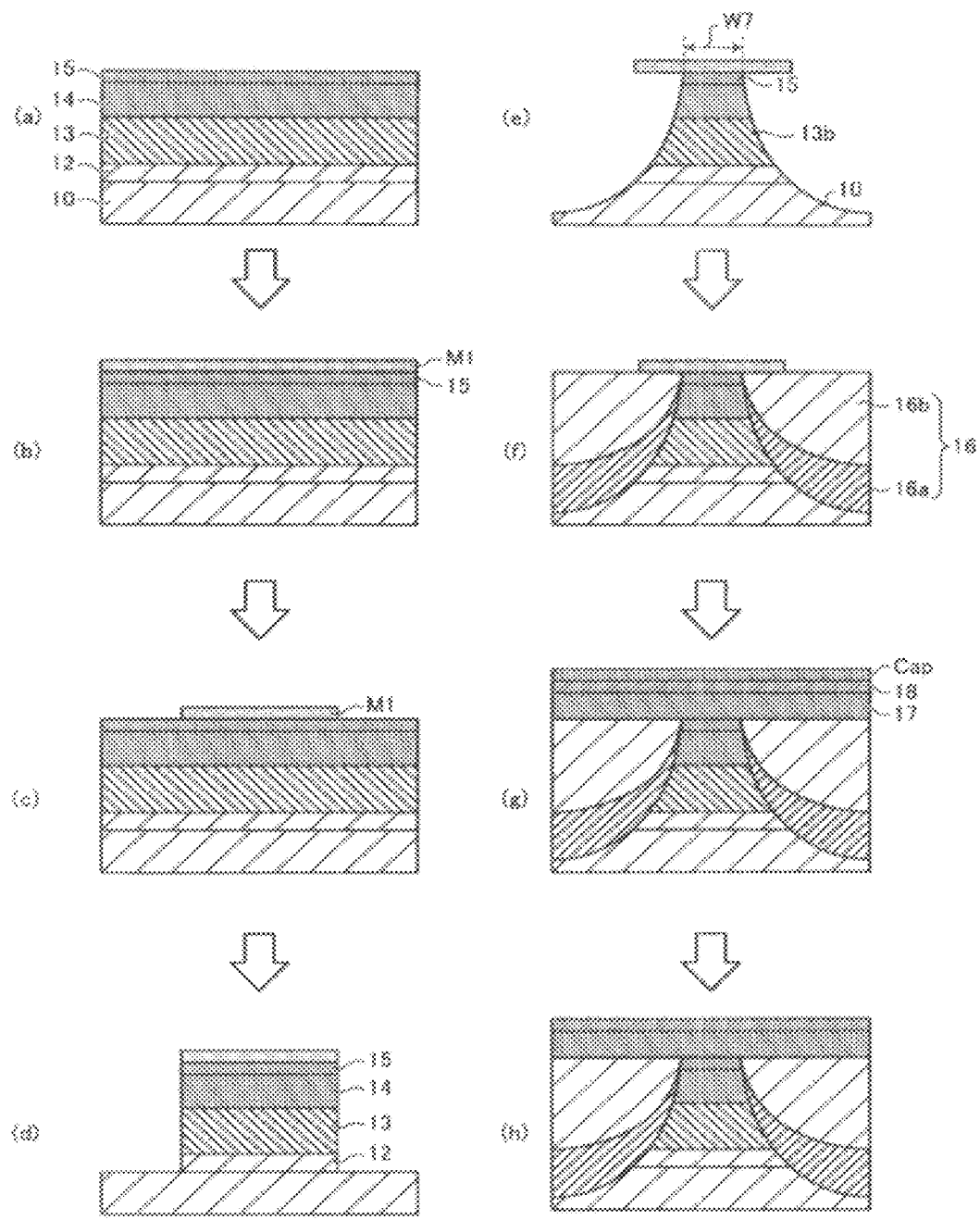
FIG. 7 are diagrams that explain one example of a manufacturing method for the semiconductor optical amplifier illustrated in FIG. 1.
Figure 8:
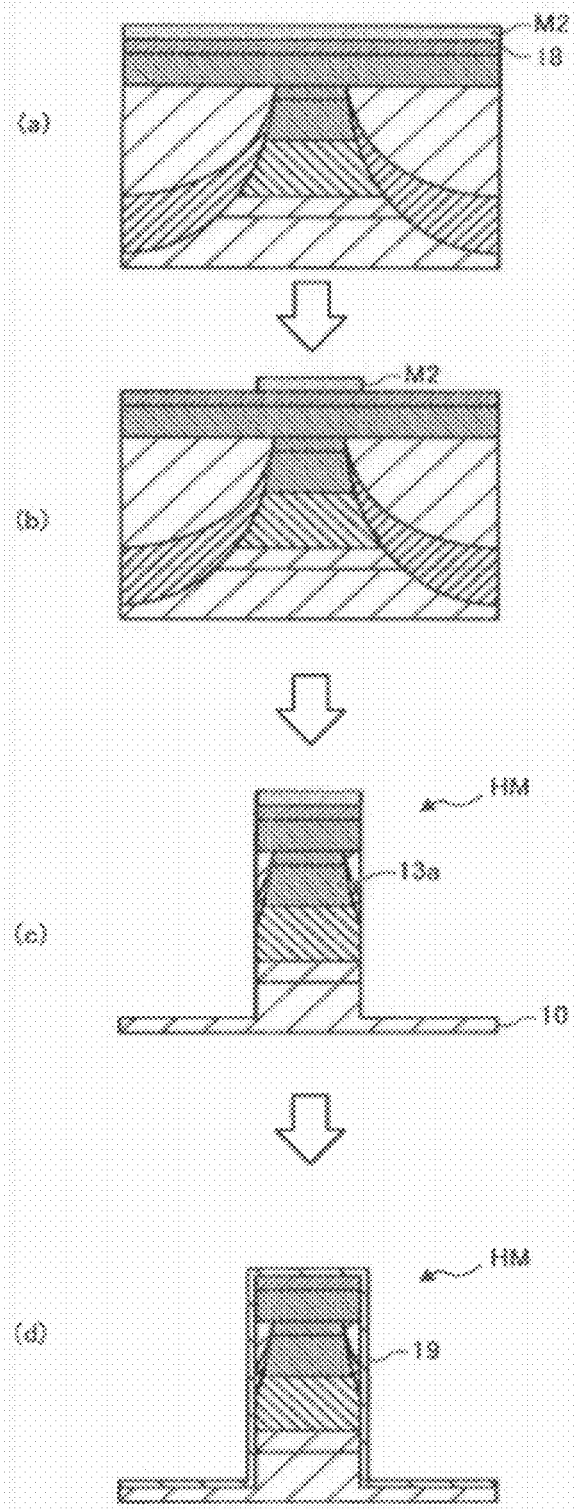
FIG. 8 are diagrams that explain one example of a manufacturing method for the semiconductor optical amplifier illustrated in FIG. 1.
Figure 9:
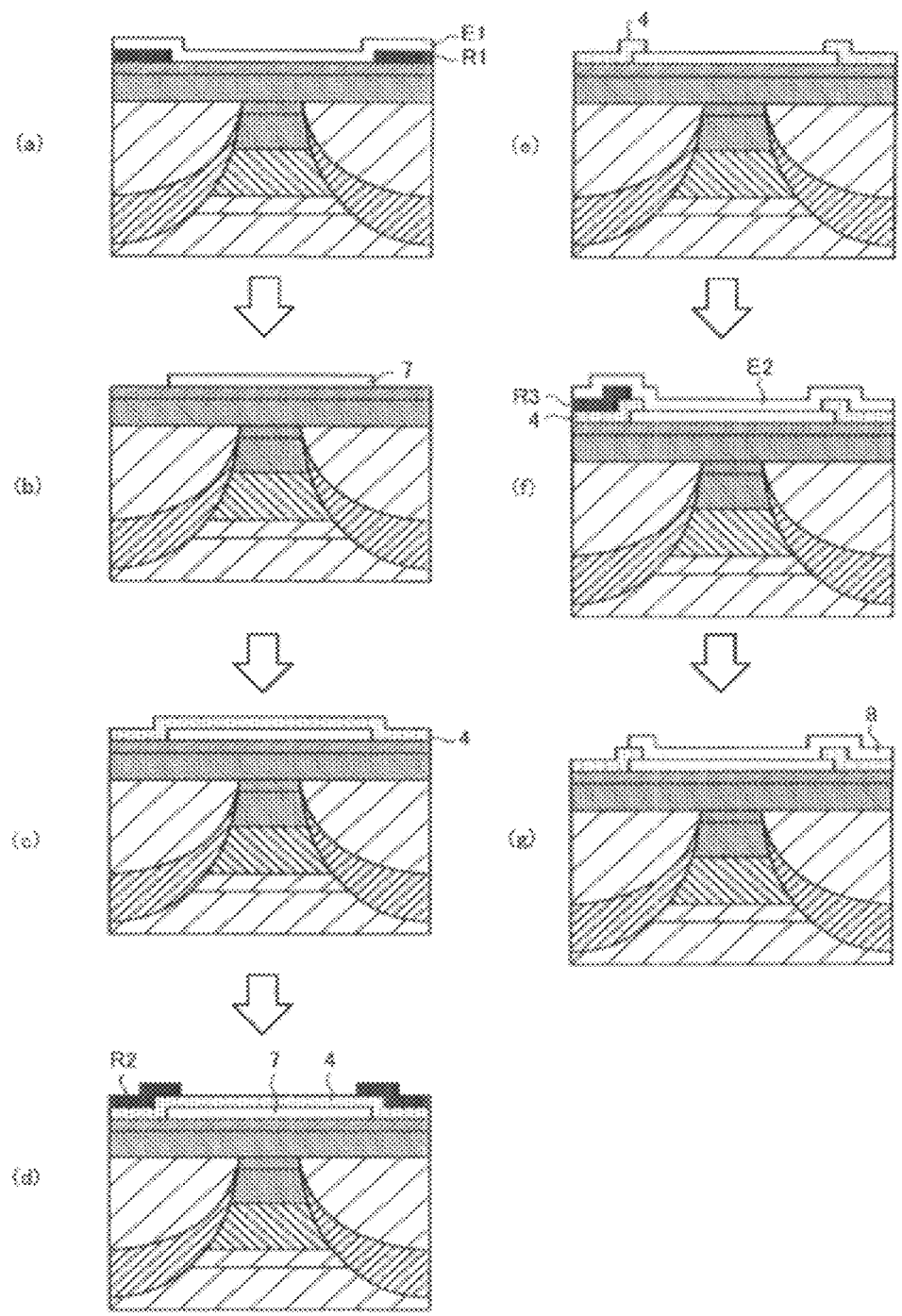
FIG. 9 are diagrams that explain one example of a manufacturing method for the semiconductor optical amplifier illustrated in FIG. 1.
Figure 10:
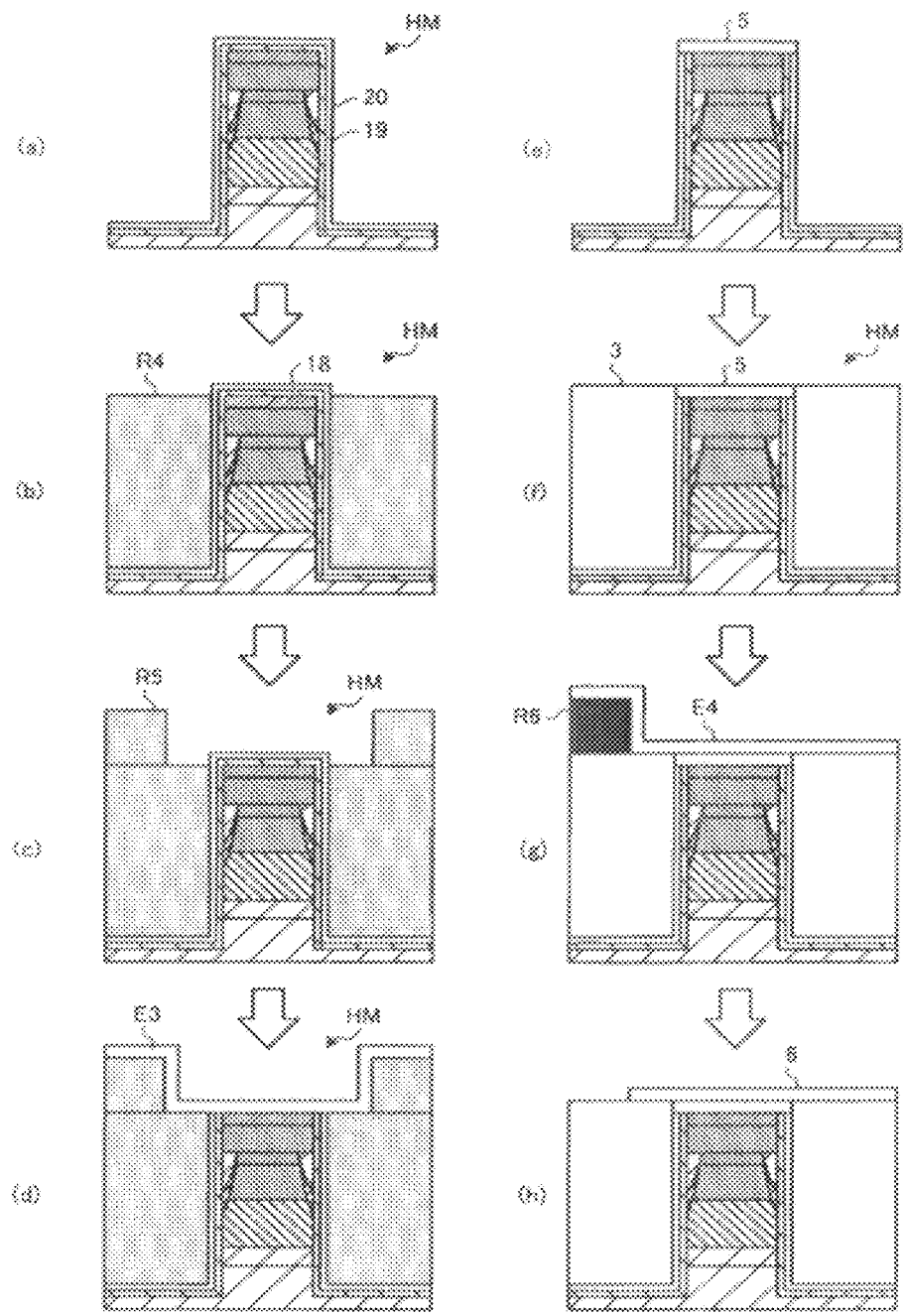
FIG. 10 are diagrams that explain one example of a manufacturing method for the semiconductor optical amplifier illustrated in FIG. 1.
Figure 14:
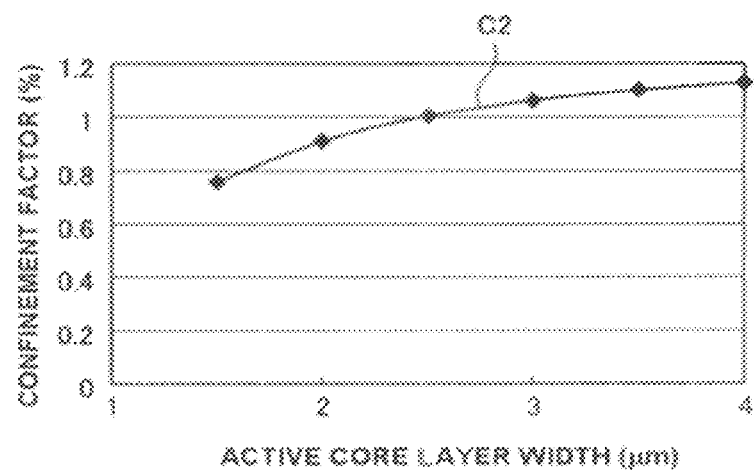
FIG. 14 is a diagram that illustrates the calculation results of the relationship between the width of the narrow width section and confinement factor in a semiconductor optical amplifier having conventional wave guide structure illustrated in FIG. 13.

Next, FIG. 6 is a diagram illustrating the calculation results of the relationship between the width of the narrow width section 30a or first active core layer 13a (active core layer width) and the confinement factor in the waveguide structure of the conventional semiconductor optical amplifier 200 illustrated in FIG. 13 and the waveguide structure of the semiconductor optical amplifier 100 of the first embodiment illustrated in FIG. 4. Here, the relative refractive index difference Δ3 of the narrow width section 30a is taken to be 0.16%, and the relative refractive index difference Δ1 of the first active core layer 13a is taken to be 45%. Moreover, curves C1 and C2 are for the semiconductor optical amplifier 100 of the first embodiment and the conventional semiconductor optical amplifier, respectively, where curve C2 is the same as curve C2 in FIG. 14. As illustrated in FIG. 6, as the active core layer width narrows from 4 μm to 1 μm, the confinement factor in the conventional semiconductor optical amplifier 200 (curve C2) decreases from 1.13% to 0.76%, however is maintained at 1.2% in this first embodiment (curve C1) and does not decrease.

As was explained above, in the semiconductor optical amplifier 100 of this first embodiment, it is possible to obtain desired high efficiency and high optical output characteristics.

(Manufacturing Method)

Next, the manufacturing method for manufacturing the semiconductor optical amplifier 100 of this first embodiment will be explained. FIGS. 7 to FIG. 10 are diagrams for explaining one example of the manufacturing method for the semiconductor optical amplifier 100 illustrated in FIG. 1. This explanation will be given with reference to section A-A in FIG. 1, with the steps for forming the common structure of overall element being mainly explained using FIG. 7, and the steps for forming the structure of the output-side optical amplifier waveguide section 2 being explained using FIG. 9. Moreover, with section B-B as a reference, the steps for forming the structure of the input-side optical amplifier waveguide section 1 are explained using FIG. 8, and FIG. 10.

First, using a Metal Organic Chemical Vapor Deposition (MOCVD) device, crystal growth as described below is performed at a growth temperature of 600° C. In other words, as illustrated in FIG. 7(a), a lower clad layer 12, semiconductor active layer 13 and upper clad layers 14 and 15 are formed on a substrate 10.

Next, as illustrated in FIGS. 7(b) and 7(c) a mask M1 composed of SiN film is formed over the entire surface of the upper clad layer 15, and this mask M1 is etched to a shape for forming the mesa structure illustrated in FIG. 4. In addition, as illustrated in FIG. 7(d), the areas of the upper clad layers 14 and 15, semiconductor active layer 13 and lower clad layer 12 except where the mask M1 is formed are removed by dry etching using a chlorine or methane/hydrogen gas. Next, as illustrated in FIG. 7(e), etching is further performed using wet etching from the upper clad layer 15 to a depth that reaches part of the substrate 10 to form the mesa structure of the waveguide structure illustrated in FIG. 4. In this step, the mesa shape of the second active core layer 13b is formed from the semiconductor active layer 13.

However, the width W7 of the upper clad layer 15 changes in the lengthwise direction to correspond with the width of the mask M1. Next, as illustrated in FIG. 7(f), a current blocking semiconductor layer 16 is formed by sequentially forming a lower current blocking semiconductor layer 16a and upper current blocking semiconductor layer 16b on both sides of the mesa structure such that the mesa structure is embedded. After that, the mask M1 is removed using BHF (buffered hydrofluoric acid). Next, as illustrated in FIG. 7(g), an upper clad layer 17 and contact layer 18 are formed, and as needed, a cap layer Cap, which is a protective layer, is formed. The cap layer Cap is removed after that as illustrated in FIG. 7(h).

Next, as illustrated in FIGS. 8(a) and (b), using the PCVD (Plasma Chemical Vapor Deposition) method, a mask M2 composed of SiN film having a thickness of 120 nm is formed on the contact layer 18 in the area where the input-side optical amplifier waveguide section 1 is to be formed, and this mask M2 is patterned to a shape in order to form a high-mesa structure.

Next, as illustrated in FIG. 8(c), the areas except where the mask M2 is formed are removed by dry etching using a chlorine or methane/hydrogen gas to a depth that reaches part of the substrate 10. In this step, together with forming a high-mesa structure HM, the mesa shape of the first active core layer 13a is formed from the semiconductor active layer 13. Next, as illustrated in FIG. 8(d), in order to reduce the surface recombination on the side surfaces of the first active core layer 13a that was exposed by dry etching, a semiconductor protective layer 19 is formed on the side surfaces of the high-mesa structure HM and the surface of the substrate 10.

Next, as illustrated in FIG. 9(a), a resist R1, which is patterned in the portion that corresponds to the output-side p-side electrode 7, is formed on the structure that was formed in FIG. 7(h) by photolithography, and an AuZn film E1 is vapor deposited over the resist R1. Next, as illustrated in FIG. 9(b), the resist R1 is removed and lifted off to form the output-side p-side electrode 7. After that, as illustrated in FIG. 9(c), a SiN dielectric protective film 4 is formed. Next, as illustrated in FIG. 9(d), a resist R2, which is patterned in the portion for bringing the electrode pad 8 in contact with the output-side p-side electrode 7, is formed on the dielectric protective film 4 by photolithography.

Next, as illustrated in FIG. 9(e), the portion of the dielectric protective film 4 where the resist R2 is patterned is etched by RIE using CF4 gas, and after that the resist R2 is removed. Furthermore, as illustrated in FIG. 9(f), a resist R3 that is patterned in the portion that corresponds to the electrode pad 8 is formed on the dielectric protective film 4 by photolithography, and a Ti/Pt film E2 is vapor deposited on top of that resist R3. After that, as illustrated in FIG. 9(g), the resist R3 is removed and lifted off to form the electrode pad 8.

Next, as illustrated in FIG. 10(a), a SiN dielectric protective film 20 is formed on the semiconductor protective layer 19 of the high-mesa structure HM that is formed in the step illustrated in FIG. 8(d). Next, as illustrated in FIG. 10(b), a positive-type resist R4 is coated over the structure such that it embeds the high-mesa structure HM, and the upper portion of the high-mesa structure is exposed by RIE. Next, as illustrated in FIG. 10(c), negative-type resist R5 is coated over the structure so that it covers the high-mesa structure HM, and the resist R5 above and around the upper portion of the high-mesa structure HM is removed by photolithography. Next, as illustrated in FIG. 10(d), just the semiconductor protective layer 19 and the dielectric protective film 20 on the contact layer 18 are removed, and an AuZn film E3 is vapor deposited over the top.

Next, as illustrated in FIG. 10(e), resists R4 and R5 are removed and lifted off to form an input-side p-side electrode 5. Then as illustrated in FIG. 10(f), photosensitive polyimide is coated over the top so as to embed the high-mesa structure HM, and the polyimide on the input-side p-side electrode 5 is removed by photolithography and wet etching is performed to form an electrode pad support member 3, then the structure is further heated to cure the electrode pad support member 3. Next, as illustrated in FIG. 10(g), a negative-type resist R6 is coated over the structure such that it covers the entire surface, then the resist R6 above and around the input-side p-side electrode 5 is removed by photolithography, and a Ti/Pt film E4 is vapor deposited over the top. After that, as illustrated in FIG. 10(h), the resist R6 is removed and lifted off to form an electrode pad 6.

Finally, the entire rear surface of the substrate is polished and an AuGeNi/Au film is vapor deposited over the polished rear surface to form an n-side electrode 11, after which the structure is sintered at 430° C. to allow ohmic contact. After that, an end surface is formed by cleavage in order to form an input section 100a and output section 100b, and this end surface is coated with an anti reflection (AR) coating in order that the reflectance is −30 dB or less, then the element is separated to complete the semiconductor optical amplifier 100.

EXAMPLE

Comparative Example

As an example of the invention, a semiconductor optical amplifier having the same structure as that of embodiment 1 was made, and as a comparative example, a semiconductor optical amplifier having the conventional structure as illustrated in FIG. 13 was made. Note, the size and material of the conventional semiconductor optical amplifier of the comparative example was the same as that of the example. In addition, for the semiconductor optical amplifiers of the example and comparative example, a signal light having a wavelength of 1.55 µM and power of 0 dBm was input from the input section, and the output power was measured while changing the driving current.

Figure 11:
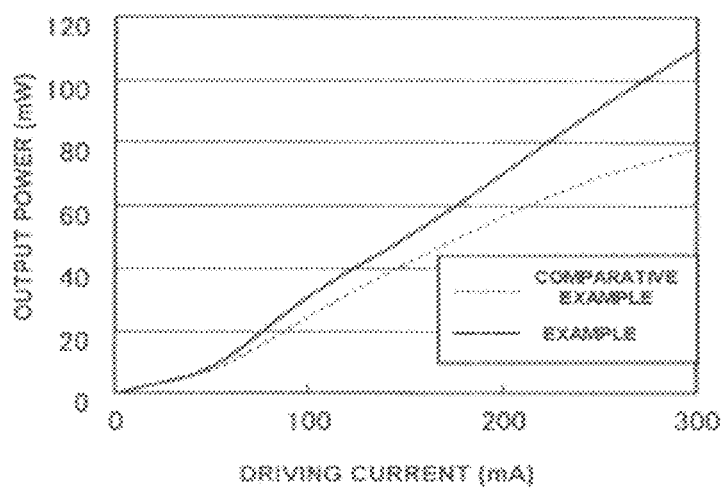
FIG. 11 is a diagram that illustrates the relationship between the driving current and light output in a semiconductor optical amplifier of an example of the invention and a comparative example.

FIG. 11 is a diagram illustrating the relationship between the driving current and the output power of the semiconductor optical amplifiers regarding the example and comparative example. As illustrated in FIG. 11, when the driving current was 300 mA, the output power of the comparative example was approximately 78 mW, and the output power of the example was approximately 110 mW, so at the same driving current, there was an improvement in output power by approximately 40%. In other words, in the semiconductor optical amplifier regarding the example of the invention, high efficiency and high output power characteristics could be obtained.

Note, in the semiconductor optical amplifier of the first embodiment or the example, the material and size of the compound semiconductor and electrodes for a wavelength of 1.55 µm are set. However, each material and size can be adequately set according to the wavelength of the laser light to be amplified, and are not particularly limited.

REFERENCE SIGNS LIST 1 input-side optical amplifier waveguide section
2 output-side optical amplifier waveguide section
3 electrode pad support member
4 dielectric protective film
5 input-side p-side electrode
6, 8 electrode pads
7 output-side p-side electrode
10 substrate
11 n-side electrode
12 lower clad layer
13 semiconductor active layer
13a first active core layer,
13b second active core layer
13ba tapered section
13bb equal width section
14, 15, 17 upper clad layer
16 current blocking semiconductor layer
16a lower current blocking semiconductor layer
16b upper current blocking semiconductor layer
18 contact layer
19 semiconductor protective layer
20 dielectric protective film
100 semiconductor optical amplifier
100a input section
100b output section
C1, C2 curve
Cap cap layer
D1, D2 electric field intensity distribution
E1-E4 film
HM high-mesa structure IL input signal light
L1-L4 length
M1-M2 mask
OL output signal light
R1-R6 resist

The invention claimed is:

1. A semiconductor optical amplifier comprising:
   an input-side optical amplifier waveguide section that has a first active core layer; and
   an output-side optical amplifier waveguide section that connects to said input-side optical amplifier waveguide section and that has a second active core layer that is wider than said first active core layer; wherein
   the width of said first active core layer and relative refractive index difference between said first active core layer and adjacent clad section in the width direction of said first active core layer, and the width of said second active core layer and relative refractive index difference between said second active core layer and adjacent clad section in the width direction of said second active core layer are set such that the carrier density and optical confinement factor in said first active core layer are higher than the carrier density and optical confinement factor in said second active core layer.

2. The semiconductor optical amplifier according to claim 1, wherein the clad section adjacent in the width direction of said first active core layer is a polyimide, and the clad section adjacent in the width direction of said second active core layer is a semiconductor.

3. The semiconductor optical amplifier according to claim 2, wherein said input-side optical amplifier waveguide section further comprises a semiconductor protective layer that is formed on at least the side surfaces of said first active core layer.

4. The semiconductor optical amplifier according to any one of the claims 1 to 3, comprising
   an input-side electrode that supplies power to said input-side optical amplifier waveguide section; and
   an output-side electrode that is electrically isolated from said input-side and that supplies power to said output-side optical amplifier waveguide section.

* * * * *